(12) United States Patent
Chen

(10) Patent No.: US 8,045,328 B1
(45) Date of Patent: Oct. 25, 2011

(54) SERVER AND COOLER MODUEL ARRANGEMENT

(75) Inventor: Po-Ching Chen, Hsichih (TW)

(73) Assignee: Chenbro Micom Co., Ltd., Chung Ho, Taipei Hsien (TW)

( * ) Notice: Subject to any disclaimer, the term of this patent is extended or adjusted under 35 U.S.C. 154(b) by 0 days.

(21) Appl. No.: 12/773,265

(22) Filed: May 4, 2010

(51) Int. Cl.
*H05K 7/20* (2006.01)

(52) U.S. Cl. ............... 361/695; 361/690; 361/679.48; 361/679.5; 361/679.51; 361/727; 165/80.3; 165/121; 165/122; 165/185; 454/184; 415/213.1; 415/214.1

(58) Field of Classification Search ............ 361/679.46–679.51, 690–697, 361/717–728, 732, 831; 165/80.2, 80.3, 165/121–126, 104.33, 104.34, 185; 454/184, 454/186; 312/223.2, 223.3, 236; 211/41.17, 211/175; 248/223.41, 500, 510, 678, 680, 248/681, 694; 415/213.1, 214.1, 220; 416/244 R, 416/247 R; 417/423.4, 423.5, 360, 423.15
See application file for complete search history.

(56) References Cited

U.S. PATENT DOCUMENTS

| | | | |
|---|---|---|---|
| 4,918,572 A * | 4/1990 | Tarver et al. ................. | 361/736 |
| 5,398,161 A * | 3/1995 | Roy .............................. | 361/727 |
| 5,816,673 A * | 10/1998 | Sauer et al. ................. | 312/223.2 |
| 6,002,586 A * | 12/1999 | Chen et al. .................... | 361/695 |
| 6,088,224 A * | 7/2000 | Gallagher et al. ............ | 361/695 |
| 6,115,250 A * | 9/2000 | Schmitt ......................... | 361/695 |
| 6,288,897 B1 * | 9/2001 | Fritschle et al. ......... | 361/679.48 |
| 6,392,872 B1 * | 5/2002 | Doustou et al. .......... | 361/679.48 |
| 6,504,718 B2 * | 1/2003 | Wu ............................... | 361/695 |
| 6,795,314 B1 * | 9/2004 | Arbogast et al. ............. | 361/695 |
| 6,839,233 B2 * | 1/2005 | Cravens et al. ............... | 361/695 |
| 7,033,206 B2 * | 4/2006 | Chang et al. .................. | 439/485 |
| 7,046,470 B2 * | 5/2006 | Yamanashi et al. ............ | 360/69 |
| 7,209,352 B2 * | 4/2007 | Chen ............................. | 361/695 |
| 7,352,571 B2 * | 4/2008 | Suzuki et al. ............ | 361/679.48 |
| 7,369,406 B2 * | 5/2008 | Matsushima et al. ......... | 361/695 |
| 7,374,259 B2 * | 5/2008 | Wu et al. .................... | 312/223.2 |
| 7,394,660 B2 * | 7/2008 | Hidaka ........................ | 361/727 |
| 7,643,281 B2 * | 1/2010 | Okamoto et al. ......... | 361/679.33 |
| 7,839,624 B2 * | 11/2010 | Lin .......................... | 361/679.02 |
| 7,864,523 B2 * | 1/2011 | Iwakiri ..................... | 361/679.49 |
| 7,920,384 B2 * | 4/2011 | Westphall et al. ............ | 361/727 |
| 2005/0227608 A1 * | 10/2005 | Wu et al. ....................... | 454/184 |
| 2005/0243513 A1 * | 11/2005 | Chou et al. .................... | 361/695 |
| 2006/0126302 A1 * | 6/2006 | Lee et al. ..................... | 361/704 |
| 2007/0135033 A1 * | 6/2007 | Kao et al. ..................... | 454/184 |
| 2009/0009961 A1 * | 1/2009 | Li ................................. | 361/687 |
| 2009/0244842 A1 * | 10/2009 | Iwakiri ....................... | 361/695 |
| 2011/0021132 A1 * | 1/2011 | Chou et al. .................... | 454/184 |
| 2011/0090629 A1 * | 4/2011 | Liu ............................ | 361/679.4 |
| 2011/0116226 A1 * | 5/2011 | Yang ....................... | 361/679.48 |

* cited by examiner

*Primary Examiner* — Michail V Datskovskiy
(74) *Attorney, Agent, or Firm* — Muncy, Geissler, Olds & Lowe, PLLC

(57) ABSTRACT

A server and cooler module arrangement includes a server accommodating a stack of an operating system and an electronic device in an accommodation chamber therein at one side and an access device unit in the accommodation chamber at an opposite side, and a cooler module, which comprises a rack mounted in a partition way in the accommodation chamber between the stack of operating system and electronic device and the access device unit and a plurality of fans respectively adjustably mounted in respective open frames at different elevations and adapted for drawing air or sending air toward different heat sources in the operating system, the electronic device and the access device unit for quick dissipation of waste heat.

7 Claims, 7 Drawing Sheets

SERVER AND COOLER MODUEL ARRANGEMENT

BACKGROUND OF THE INVENTION

1. Field of the Invention

The present invention relates to server cooling technology and more particularly, to a server and cooler module arrangement, which has fans arranged at different elevations to aim at different heat sources for quick dissipation of waste heat during operation of the server.

2. Description of the Related Art

Following fast development of semiconductor technology, the packaging density of electronic devices is comparatively higher, and the size of electronic devices is comparatively smaller. High-speed electronic devices consume much electric energy, and release much heat energy during operation. If waste heat is not quickly carried away, the problems of electron ionization and thermal stress may occur, lowering system stability and reliability and shortening the lifespan of the electronic components. Therefore, heat dissipation is an important issue to be settled.

Nowadays, computer has been intensively used as tool means in many different fields for different purposes. The life cycle of computer becomes short to meet marketing requirement. In consequence, the replacement rate and culling rate of computer electronic components, such as CPU (central processing unit) and GPU (graphic processing unit), are high. During operation of a computer, the CPU(s), IC chips, power supply device, CD-ROM and other electronic components of the operating system will release waste heat. If waste heat from the CPU(s), IC chips, power supply device, CD-ROM and other electronic components of the operating system is not quickly dissipated, it will be accumulated in the computer, affecting normal functioning of the CPU(s), IC chips, power supply device, CD-ROM and electronic components of the operating system. In order to prevent accumulation of waste heat in a computer, for example, server computer, multiple cooling fans are usually used. Cooling fans use air as a medium to dissipate heat without damaging electronic component parts. Subject to a reasonable design, cooling fans can effectively carry waste heat away from a server computer, avoiding accumulation of waste heat.

According to the prior art, as shown in FIG. 7, a bracket B is mounted inside a server A to support a plurality of cooling fans B1 that are operable to send cooling air toward a circuit board A1, a power supply device A2 and electronic devices A3 (mobile HDD, CD-ROM, and etc.). The cooling fans B1 are fixedly mounted on the bracket B at fixed locations to send air in predetermined directions. According to this design, the positions of the cooling fans B1 cannot be separately adjusted to aim at the respective heat sources at the circuit board A1, power supply device A2 and electronic devices A3. Thus, the cooling fans B1 cannot accurately send air toward the respective heat sources at the circuit board A1, power supply device A2 and electronic devices A3 to effectively carry waste heat away from the internal space of the server A to the outside open air.

Therefore, the aforesaid prior art design has drawbacks as follows:

1. To fit different operation and control requirements, the server A may have new electronic parts and electronic devices A3 installed therein. When new electronic parts and electronic devices A3 are installed in the server A, the cooling fans B1 cannot be adjusted to send cooling air toward the new heat sources, causing accumulation of waste heat in the server A.

2. The circuit board A1 and the power supply device A2 may be respectively equipped with a respective mini fan for cooling. The working directions of the cooling fans B1 may be unable to effectively carry exhaust air of the mini fans of the circuit board A1 and the power supply device A2 away from the internal space of the server A, causing accumulation of waste heat in the server A.

Therefore, it is desirable to provide a server and cooler module arrangement, which dissipates waste heat rapidly during operation of the server, preventing accumulation of waste heat in the server.

SUMMARY OF THE INVENTION

The present invention has been accomplished under the circumstances in view. It is one object of the present invention to provide a server and cooler module arrangement, which allows adjustment of the positions of cooling fans subject to the locations of the heat sources so that waste heat can be quickly carried away from the server during operation of the server.

To achieve this and other objects of the present invention, a server and cooler module arrangement comprises a server, and a cooler module mounted in the server for carrying waste heat out of the server efficiently. The server comprises an accommodation chamber, a partition way defined in the accommodation chamber, an operating system and an electronic device arranged in a stack in the accommodation chamber at one side relative to the partition way, an access device unit arranged in the accommodation chamber at an opposite side relative to the partition way, and a plurality of thermal zones located on an outer side of the operating system in communication with the space outside the server. The cooler module comprises a rack mounted in the partition way and having a plurality of open frames, and a plurality of fans respectively adjustably mounted in the open frames and respectively aimed at the operating system, the electronic device and the access device unit for drawing air or sending air toward the operating system, the electronic device and the access device unit to dissipate waste heat.

Further, the fans are adjustably mounted in the open frames of the rack at different elevations and respectively aimed at the operating system, the electronic device and the access device unit for drawing air or sending air toward different heat sources at the operating system, the electronic device and the access device unit for quick dissipation of waste heat.

DETAILED DESCRIPTION OF THE PREFERRED EMBODIMENT

Figure 1:
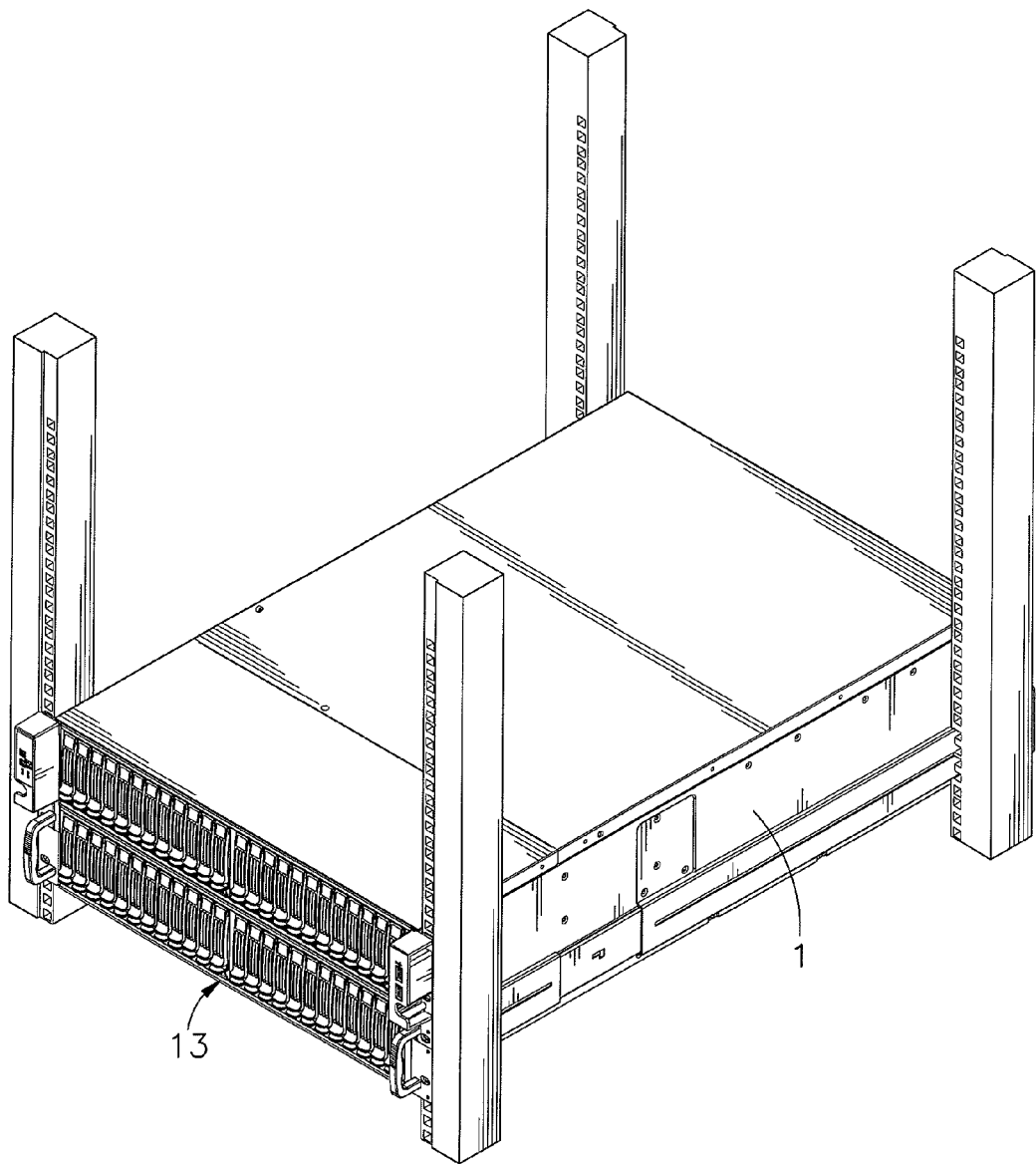
FIG. 1 is an elevational view of a server and cooler module arrangement according to the present invention.
Figure 2:
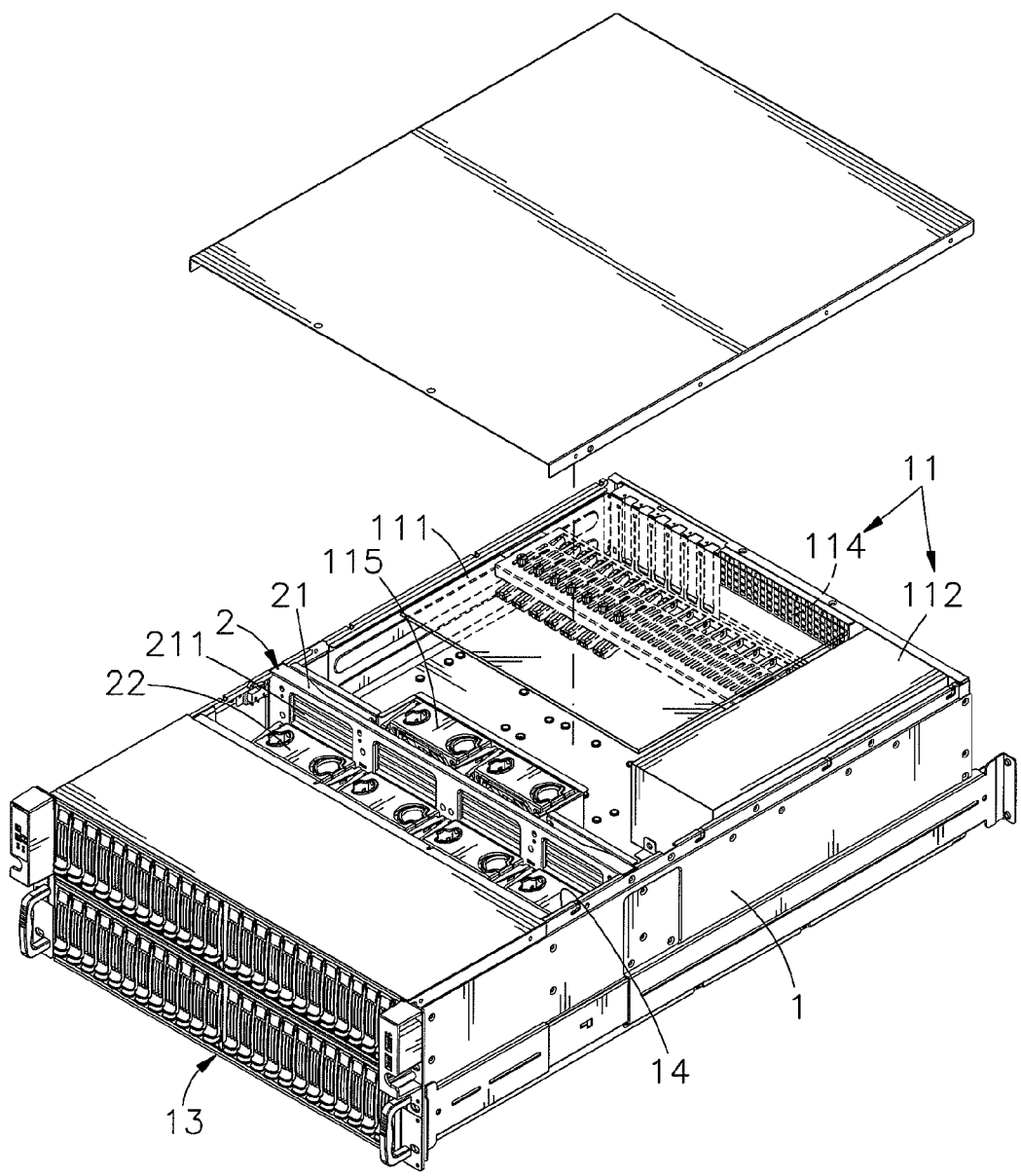
FIG. 2 illustrates the internal structure of the server and cooler module arrangement in accordance with the present invention after opening of the top cover panel.
Figure 3:
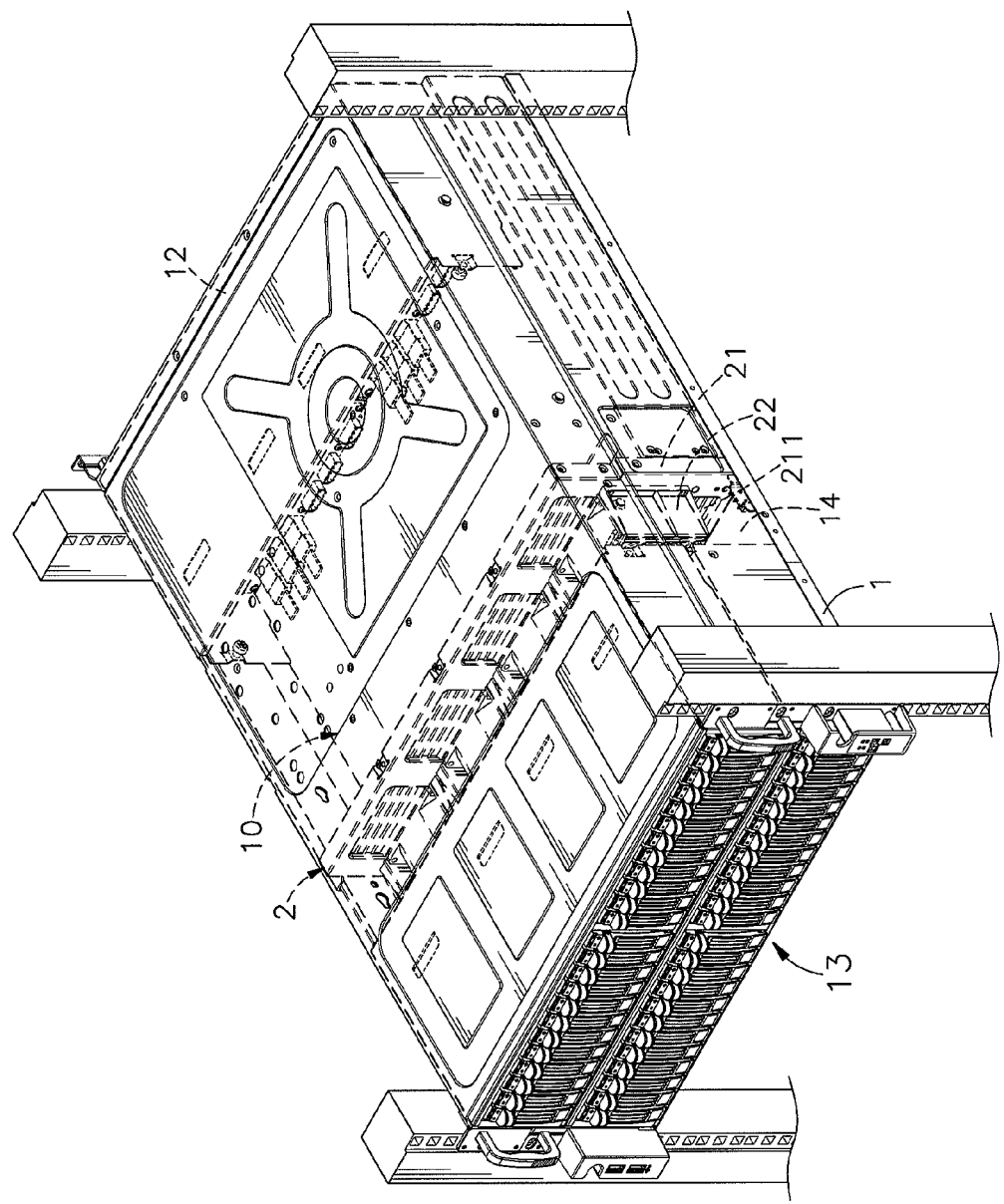
FIG. 3 is a perspective view of the server and cooler arrangement according to the present invention.
Figure 4:
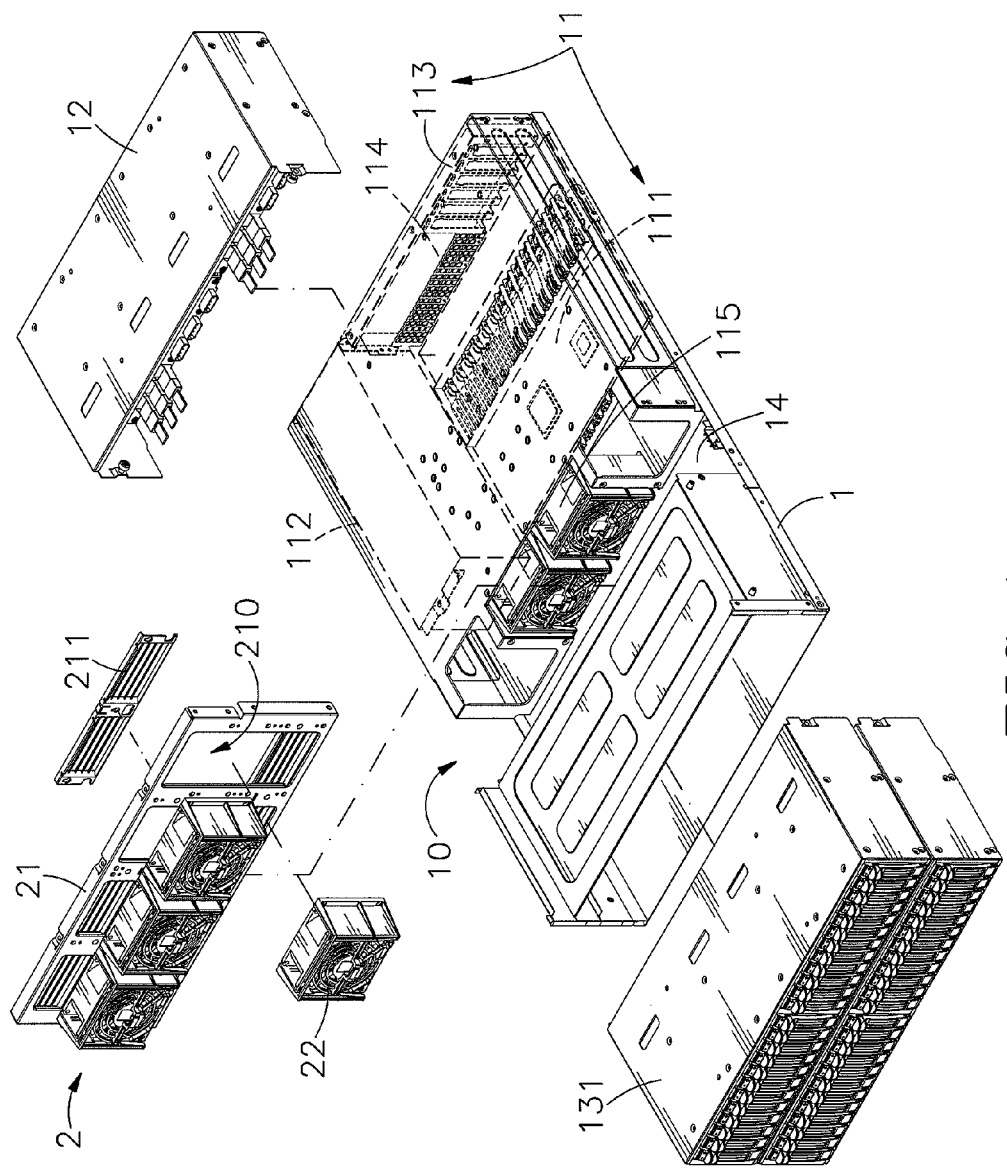
FIG. 4 is an exploded view of the server and cooler module arrangement according to the present invention.
Figure 5:
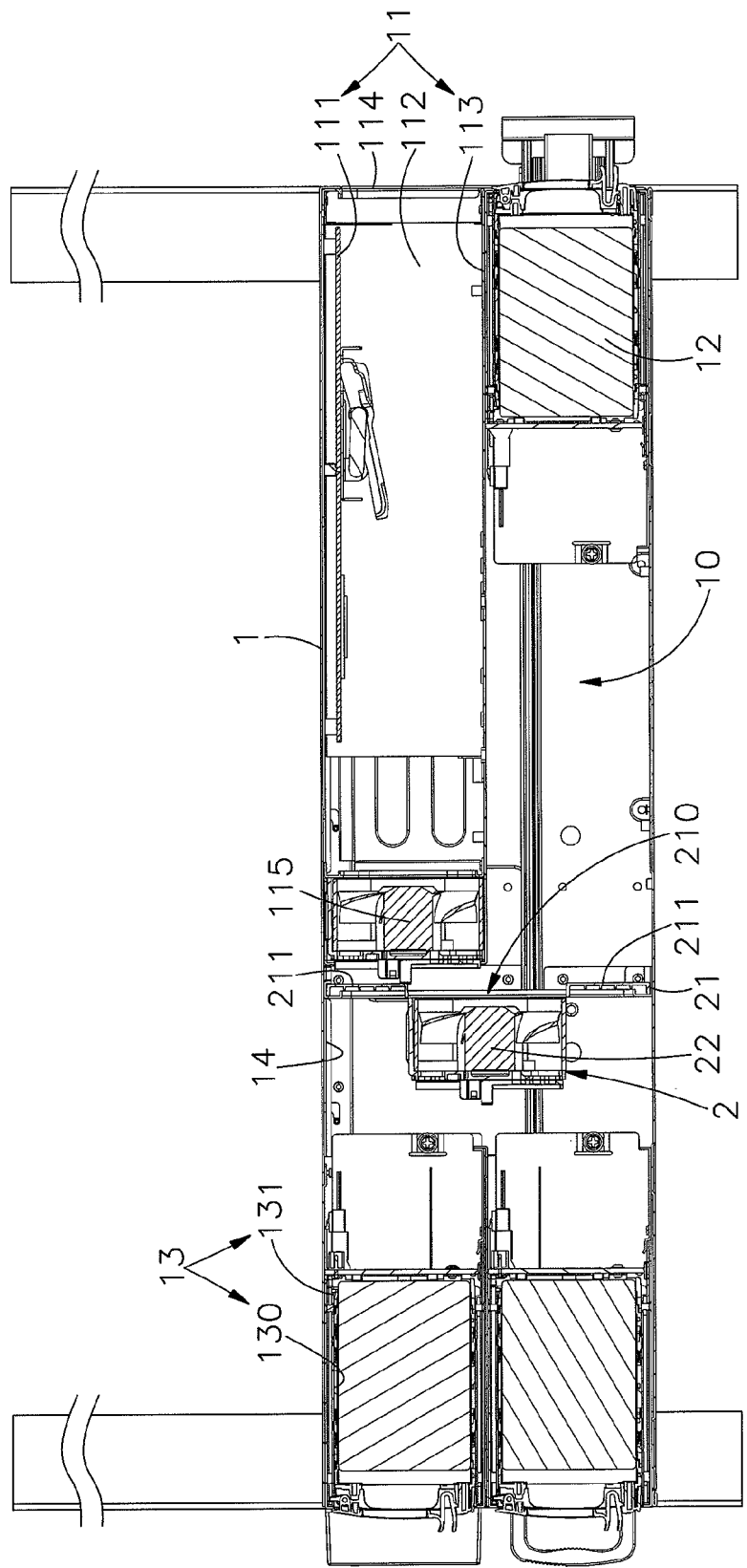
FIG. 5 is a schematic sectional side view of the server and cooler module arrangement according to the present invention.

Referring to FIGS. 1-5, a server and cooler module arrangement in accordance with the present invention is shown comprising a server 1 and a cooler module 2.

The server 1 comprises an accommodation chamber 10, an operating system 11 and an electronic device 12 arranged in a stack in the accommodation chamber 10 at one side, an access device unit 13 arranged in the accommodation chamber 10 at an opposite side, and a partition way 14 defined between the stack of the operating system 11 and electronic device 12 and the access device unit 13. The operating system 11 comprises a circuit board 111 carrying a circuit layout, a power supply device 112 and other requisite electronic components, an isolation frame 113 covering the circuit board 111 and the power supply device 112 and a plurality of thermal zones 114 located on the isolation frame 113 adjacent to the circuit board 111 in communication between the space inside the operating system 11 and the space outside the server 1. Further, the electronic device 12 is stacked on the top side of the isolation frame 113 of the operating system 11.

The cooler module 2 comprises a rack 21 having a plurality of open frames 210, and a plurality of fans 22 respectively adjustably mounted in the open frames 210 at different elevations. The mounting arrangement between each fan 22 and the associating open frame 210 allows adjustment of the fan 22 relative to the rack 21 to the desired elevation and position.

During installation, the rack 21 of the cooler module 2 is mounted in the partition way 14 inside the accommodation chamber 10 between the stack of the operating system 11 and electronic device 12 and the access device unit 13, and then the fans 22 are respectively mounted in the open frames 210 and respectively adjusted to the respective optimal positions corresponding to the circuit board 111, the power supply device 112, the electronic device 12 and the access device unit 13 to draw air or send air, avoiding accumulation of heat in the server 1.

The aforesaid electronic device 12 and access device unit 13 include at least one mobile hard disk drive (2.5-inch HDD or 3.5-inch HDD), at least one CD-ROM, at least one multimedia access device and other electronic tools for server application. The thermal zones 114 are heat dissipation holes in communication between the inside space of the server 1 and the atmosphere. The open frames 210 are rectangular frames spaced on the rack 21. The fans 22 are respectively mounted in the open frames 210 and respectively adjusted to the desired elevations and positions and then respectively affixed to the rack 21 with fastening members, for example, screws. Further, the open frames 210 can be formed integral with one another, i.e., the rack 21 is a single-piece member. Alternatively, the open frames 210 can be separately made and then fastened together to form the rack 21. After installation of the fans 22 in the open frames 210 of the rack 21, baffles 211 are affixed to the rack 21 to block the gaps in the open frames 210 outside the fans 22, avoiding air rampant, backflow or air disturbance, and lowering the noise level.

Figure 6:
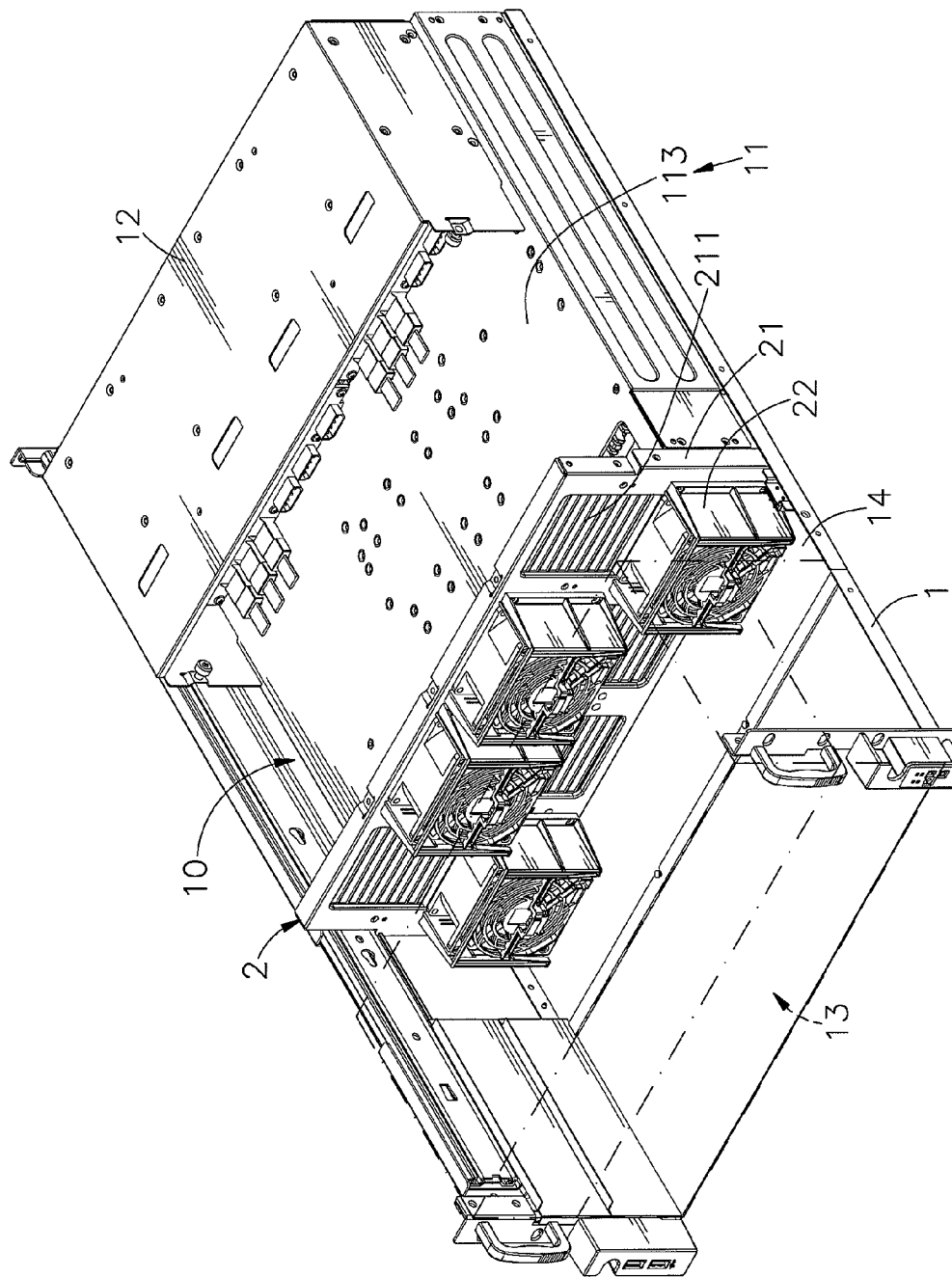
FIG. 6 is an elevational assembly view of a part of the server and cooler module arrangement according to the present invention.
Figure 7:
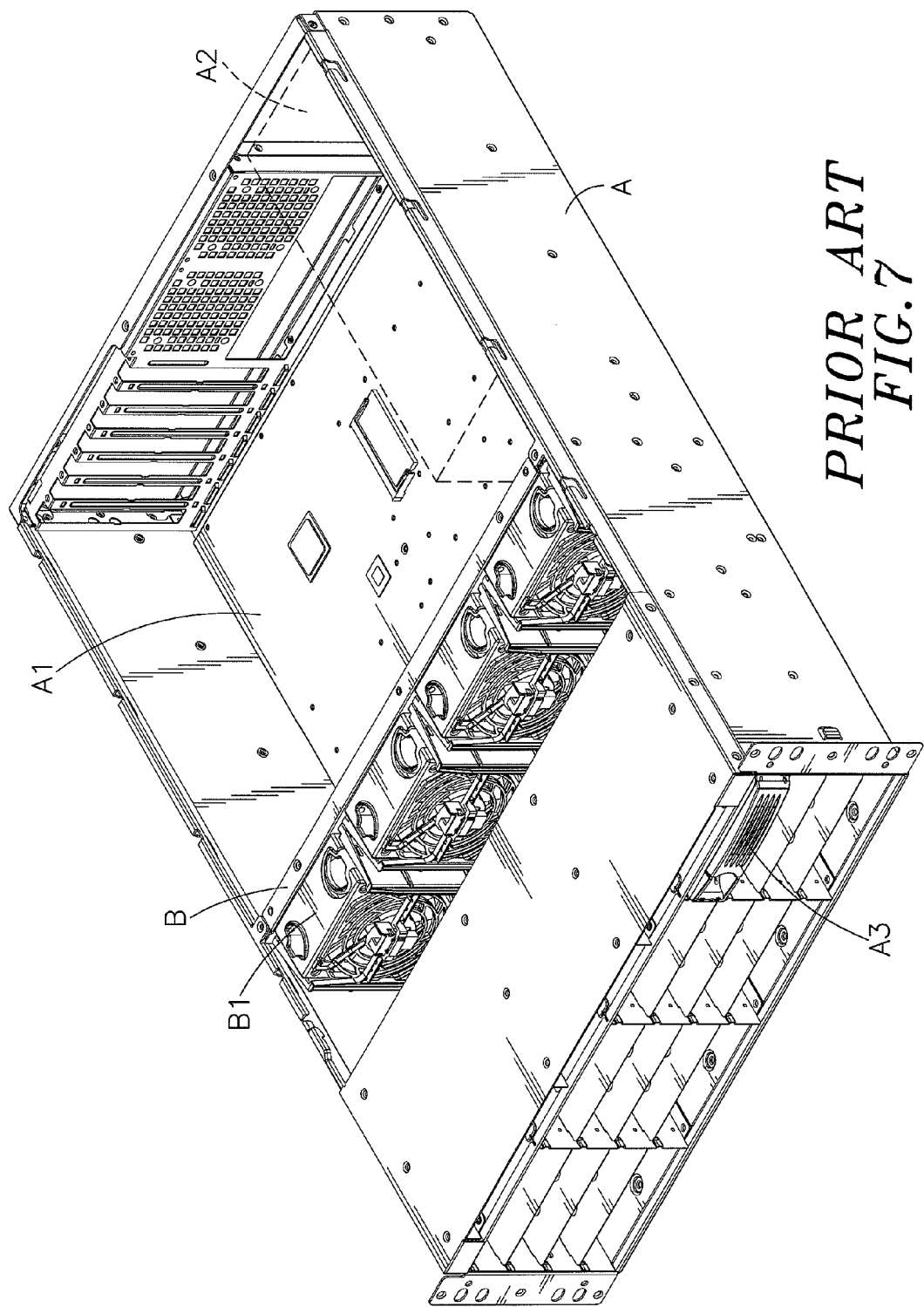
FIG. 7 illustrates the arrangement of fans in a server according to the prior art.

Referring to FIG. 6 and FIGS. 3-5 again, the partition way 14 is defined in the server 1 between the stack of the operating system 11 and electronic device 12 and the access device unit 13 in the accommodation chamber 10, and the rack 21 of the cooler module 2 is mounted in the partition way 14 inside the accommodation chamber 10 to hold the fans 22 in the open frames 210 thereof in the respective optimal positions corresponding to the circuit board 111, the power supply device 112, the electronic device 12 and the access device unit 13. Thus, the fan 22 can draw air or send air to carry waste heat away from the heat source (CPU, IC chip, interface card or electronic component at the circuit board 111 or in the electronic device 12) of the server 1 through the thermal zones 114. The fans 22 can also carry exhaust air from a system fan 115 of the operating system 11 and the internal fan (not shown) of the power supply device 12 out of the server 1 through the thermal zones 114, avoiding accumulation of heat in the accommodation chamber 10 of the server 1.

Further, the stack of the operating system 11, the electronic device 12 and the access device unit 13 are arranged in the accommodation chamber 10 subject to their heat energy releasing characteristics so that high energy heat sources and low energy heat sources are arranged at different elevations. Further, the fans 22 are vertically adjustably mounted in the open frames 210 of the rack 21 to draw air or send air toward the respective heat sources, thereby carrying waste heat away from the respective heat sources of the server 1 to the outside open air through the thermal zones 114 rapidly and efficiently. Thus, the effective utilization of the space of the accommodation chamber 10 for the arrangement of different heat sources of the server 1 avoids accumulation of waste heat in a particular place inside the accommodation chamber 10, facilitating heat dissipation.

Further, the access device unit 13, which is mounted in the accommodation chamber 10 at one side of the partition way 14 opposite to the stack of the operating system 11 and electronic device 12, comprises a casing 131 that defines therein a plurality of compartments 130, and at least one mobile hard disk drive (2.5-inch HDD or 3.5-inch HDD) and at least one CD-ROM and/or at least one multimedia access device respectively mounted in the compartments 130 inside the casing 131. The modularized design of the access device unit 13 the casing 131 in facilitates its installation in the accommodation chamber 10. Thus, the installation of the access device unit 13 requires less installation time and labor.

It is to be understood that the disclosure of the aforesaid preferred embodiment is simply an example of the present invention but not a limitation. In general, the server and cooler module arrangement comprises a server 1, which defines therein an accommodation chamber 10 and a partition way 14 in the accommodation chamber 10 and accommodates a stack of an operating system 11 and an electronic device 12 in the accommodation chamber 10 at one side relative to the partition way 14 and an access device unit 13 in the accommodation chamber 10 at an opposite side relative to the partition way 14, and a cooler module 2, which comprises a rack 21 mounted in the partition way 14 in the accommodation chamber 10 of the server 1 and a plurality of fans 22 respectively adjustably mounted in respective open frames 210 at two opposite sides at different elevations and adapted for drawing air or sending air toward different heat sources in the operating system 11, the electronic device 12 and the access device unit 13 for quick dissipation of waste heat. The positions of the fans 22 are adjustable so that the fans 22 can draw air or send air to carry waste heat away from the operating system 11, the electronic device 12 and the access device unit 13 efficiently, avoiding accumulation of waste heat in the server 1 and assuring smooth functioning of the operating system 11, the electronic device 12 and the access device unit 13.

As indicated above, the server and cooler module arrangement of the present invention has the following advantages and features:

1. The operating system 11 and the electronic device 12 are arranged in a stack in the accommodation chamber 10, and the positions of the fans 22 are adjustable subject to the elevations of the heat sources in the operating system 11 and the electronic device 12 so that the fans 22 can draw air or send air to carry waste heat away from the operating system 11 and the electronic device 12 efficiently.

2. During operation of the system fan 115 of the operating system 11 and the internal fan of the power supply device 12 to dissipate waste heat, the fans 22 of the cooler module 2 are operated to carry exhaust air from the system fan 115 of the operating system 11 and the internal fan of the power supply device 12 out of the server 1 through the thermal zones 114, avoiding accumulation of waste heat in the accommodation chamber 10 of the server 1.

In conclusion, the operating system and the electronic device are arranged in a stack in the accommodation chamber of the server at one side, the access device unit is arranged in the accommodation chamber at an opposite side, and the rack of the cooler module is set in the accommodation chamber between the stack of operation system and electronic device and the access device unit with the fans respectively adjustably mounted in respective open frames at different elevations for drawing air or sending air toward different heat sources in the operating system, the electronic device and the access device unit for quick dissipation of waste heat.

Although a particular embodiment of the invention has been described in detail for purposes of illustration, various modifications and enhancements may be made without departing from the spirit and scope of the invention.

What the invention claimed is:

1. A server and cooler module arrangement, comprising:
    a server, said server comprising an accommodation chamber, a partition way defined in said accommodation chamber, an operating system and an electronic device arranged in a stack in said accommodation chamber at one side relative to said partition way, an access device unit arranged in said accommodation chamber at an opposite side relative to said partition way, and a plurality of thermal zones located on an outer side of said operating system in communication with the space outside said server; and
    a cooler module, said cooler module comprising a rack mounted in said partition way, said rack having a plurality of open frames, and a plurality of fans respectively adjustably mounted in said open frames at different elevations and respectively aimed at said operating system and said electronic device.

2. The server and cooler module arrangement as claimed in claim 1, wherein said operating system comprises a circuit board carrying a circuit layout, a power supply device and an isolation frame covering said circuit board and said power supply device.

3. The server and cooler module arrangement as claimed in claim 1, wherein said electronic device is stacked on said operating system, comprising at least one hard disk drive and at least one CD-ROM.

4. The server and cooler module arrangement as claimed in claim 1, wherein said access device unit comprises at least one hard disk drive, at least one CD-ROM and at least one multimedia access device.

5. The server and cooler module arrangement as claimed in claim 1, wherein said open frames of said rack are rectangular open frames; said cooler module further comprises a plurality of baffles affixed to said rectangular open frames of said rack outside said fans.

6. The server and cooler module arrangement as claimed in claim 1, wherein said rectangular open frames are formed integrally with one another.

7. The server and cooler module arrangement as claimed in claim 1, wherein said open frames are separately made and then fastened together to form said rack.

* * * * *